(12) United States Patent
Park et al.

(10) Patent No.: US 9,000,563 B2
(45) Date of Patent: Apr. 7, 2015

(54) CAPACITOR AND REGISTER OF SEMICONDUCTOR DEVICE, MEMORY SYSTEM INCLUDING THE SEMICONDUCTOR DEVICE, AND METHOD OF MANUFACTURING THE SEMICONDUCTOR DEVICE

(71) Applicant: SK Hynix Inc., Icheon-si Gyeonggi-do (KR)

(72) Inventors: Sun Mi Park, Seoul (KR); Sang Hyun Oh, Anyang-si (KR); Sang Bum Lee, Incheon (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/527,170

(22) Filed: Oct. 29, 2014

(65) Prior Publication Data
US 2015/0050796 A1  Feb. 19, 2015

Related U.S. Application Data

(62) Division of application No. 13/616,439, filed on Sep. 14, 2012, now Pat. No. 8,901,707.

(30) Foreign Application Priority Data

Dec. 19, 2011 (KR) .................. 10-2011-0137339

(51) Int. Cl.
*H01L 21/02* (2006.01)
*H01L 29/40* (2006.01)
*H01L 21/20* (2006.01)
*H01L 21/44* (2006.01)
*H01L 49/02* (2006.01)
*H01L 27/108* (2006.01)

(52) U.S. Cl.
CPC .......... *H01L 28/60* (2013.01); *H01L 27/10844* (2013.01)

(58) Field of Classification Search
CPC ............ H01L 27/0805; H01L 27/11573; H01L 27/11582; H01L 28/91
USPC ............ 257/532, 773, E21.008, E21.586, 257/E23.011, E23/168; 438/381, 675
See application file for complete search history.

(56) References Cited

U.S. PATENT DOCUMENTS

| | | | | |
|---|---|---|---|---|
| 5,004,956 A * | 4/1991 | Kun et al. | ...... | 345/76 |
| 2009/0090965 A1* | 4/2009 | Kito et al. | ...... | 257/326 |
| 2009/0146206 A1* | 6/2009 | Fukuzumi et al. | ...... | 257/324 |
| 2011/0031550 A1* | 2/2011 | Komori et al. | ...... | 257/324 |
| 2011/0299314 A1* | 12/2011 | Samachisa et al. | ...... | 365/51 |

* cited by examiner

*Primary Examiner* — Long K Tran
*Assistant Examiner* — Dzung Tran
(74) *Attorney, Agent, or Firm* — William Park & Associates Patent Ltd.

(57) ABSTRACT

A capacitor of a semiconductor device includes a capacitor structure configured to include electrode layers and dielectric layers alternately stacked, edge regions each stepwise patterned, and a central region disposed between the edge regions, sacrificial layers disposed within the respective electrode layers in the edge regions of the capacitor structure, and support plugs formed in the central region of the capacitor structure and configured to penetrate the electrode layers and the dielectric layers.

10 Claims, 12 Drawing Sheets

FIG. 1
(RPRIOR ART)

CAPACITOR AND REGISTER OF SEMICONDUCTOR DEVICE, MEMORY SYSTEM INCLUDING THE SEMICONDUCTOR DEVICE, AND METHOD OF MANUFACTURING THE SEMICONDUCTOR DEVICE

CROSS-REFERENCE TO RELATED APPLICATION

Priority to Korean patent application number 10-2011-0137339 filed on Dec. 19, 2011, the entire disclosure of which is incorporated by reference herein, is claimed.

BACKGROUND

1. Technical Field

Embodiments of this disclosure generally relate to a semiconductor device and a method of manufacturing the same and, more particularly, to the capacitor and register of a semiconductor device, a memory system including the semiconductor device, and a method of manufacturing the semiconductor device.

2. Related Art

A nonvolatile memory device retains data stored therein although the supply of power is cut off. As the recent improvement of the degree of integration of 2-D memory devices in which memory cells are formed in a single layer over a silicon substrate reaches the limit, there is proposed a 3-D nonvolatile memory device in which memory cells are vertically stacked in multiple layers from a silicon substrate.

The structure of a known 3-D nonvolatile memory device and problems thereof are described in detail below.

Figure 1:
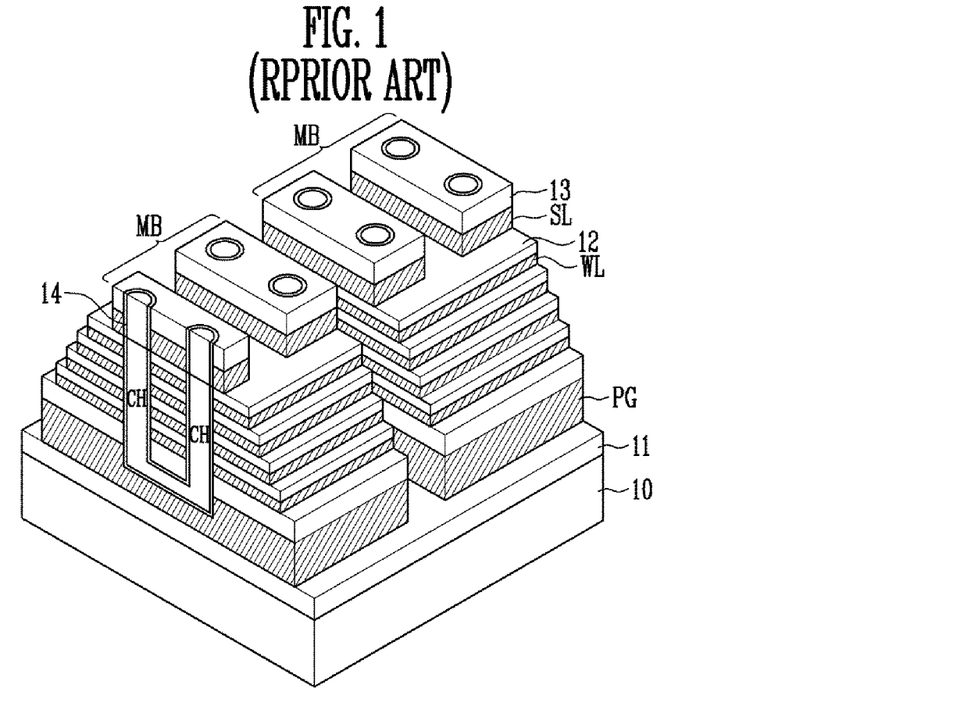
FIG. 1 is a perspective view illustrating the structure of a known 3-D nonvolatile memory device.

FIG. 1 is a perspective view illustrating the structure of a known 3-D nonvolatile memory device.

As shown in FIG. 1, the known 3-D nonvolatile memory device includes pipe gates PG formed by etching conductive layers and interlayer insulating layers 11, 12, and 13 which are alternately stacked over a substrate 10, word lines WL, and select lines SL. The known 3-D nonvolatile memory device further includes U-shaped channels CH, each including a pipe channel buried within the pipe gate PG and a pair of channels coupled to the pipe channel and formed to penetrate the interlayer insulating layers 12 and the word lines WL. The U-shaped channel CH is substantially surrounded by a tunnel insulating layer, a charge trap layer, and a charge blocking layer 14.

In accordance with the known technology, the 3-D nonvolatile memory device includes memory blocks MB formed of multi-layered layers stacked over the substrate 10 in a cell region, and a transistor, a capacitor, and a register disposed in a peripheral circuit region have a single layer structure. Thus, a step between the cell region and the peripheral circuit region is great. Accordingly, the difficulty of a manufacture process is great, and there is a high probability that a failure may occur.

BRIEF SUMMARY

An embodiment of this disclosure relates to the capacitor and register of a semiconductor device which are capable of reducing a step between a cell region and a peripheral circuit region, a memory system including the semiconductor device, and a method of manufacturing the semiconductor device.

In an embodiment of this disclosure, the capacitor of a semiconductor device includes a capacitor structure on which edge regions each stepwise patterned and a central region disposed between the edge regions are defined, and configured to include electrode layers and dielectric layers alternately stacked; sacrificial layers disposed within the respective electrode layers in the edge regions of the capacitor structure; support plugs formed in the central region of the capacitor structure and configured to penetrate the electrode layers and the dielectric layers; first slits formed in the central region of the capacitor structure and each disposed between the support plugs, one or more second slits formed in the edge regions of the capacitor structure; and an insulating layer buried in the first slits and the one or more second slits.

In an embodiment of this disclosure, the register of a semiconductor device includes a register structure on which edge regions each stepwise patterned and a central region disposed between the edge regions are defined, and configured to include register layers and interlayer insulating layers alternately stacked; sacrificial layers disposed within the respective register layers in the edge regions of the register structure; support plugs formed in the central region of the register structure and configured to penetrate the register layers and the interlayer insulating layers; first slits formed in the central region of the register structure and each disposed between the support plugs; and one or more second slits formed in the edge regions of the register structure.

In an embodiment of this disclosure, a method of forming the capacitor of a semiconductor device includes forming a capacitor structure on which edge regions each stepwise patterned and a central region disposed between the edge regions are defined, and configured to include sacrificial layers and dielectric layers alternately stacked and support plugs placed in the central region; forming first slits, each placed between the support plugs of the central region, and one or more second slits placed in the edge regions by etching the sacrificial layers and the dielectric layers; etching the sacrificial layers exposed to the inner walls of the first slits and the second slits so that the sacrificial layers of the central region are fully removed and the sacrificial layers of the edge regions remain partially; and forming electrode layers for the capacitor by filling the etched regions of the sacrificial layers with a conductive layer.

In an embodiment of this disclosure, a method of forming the register of a semiconductor device includes forming a register structure on which edge regions each stepwise patterned and a central region disposed between the edge regions are defined, and configured to include sacrificial layers and interlayer insulating layers alternately stacked and support plugs placed in the central region; forming first slits, each placed between the support plugs of the central region, and one or more second slits placed in the edge regions by etching the sacrificial layers and the interlayer insulating layers; etching the sacrificial layers exposed to the inner walls of the first slits and the second slits so that the sacrificial layers of the central region are fully removed and the sacrificial layers of the edge regions remain partially; and forming register layers by filling the etched regions of the sacrificial layers with a conductive layer.

BRIEF DESCRIPTION OF THE DRAWINGS

FIGS. 5A to 9B are cross-sectional views illustrating a method of manufacturing a semiconductor device according to an embodiment of this disclosure;

DESCRIPTION OF EMBODIMENTS

Hereinafter, some various embodiments of the present disclosure will be described in detail with reference to the accompanying drawings. The figures are provided to allow those having ordinary skill in the art to understand the scope of the embodiments of the disclosure.

Figure 2A:
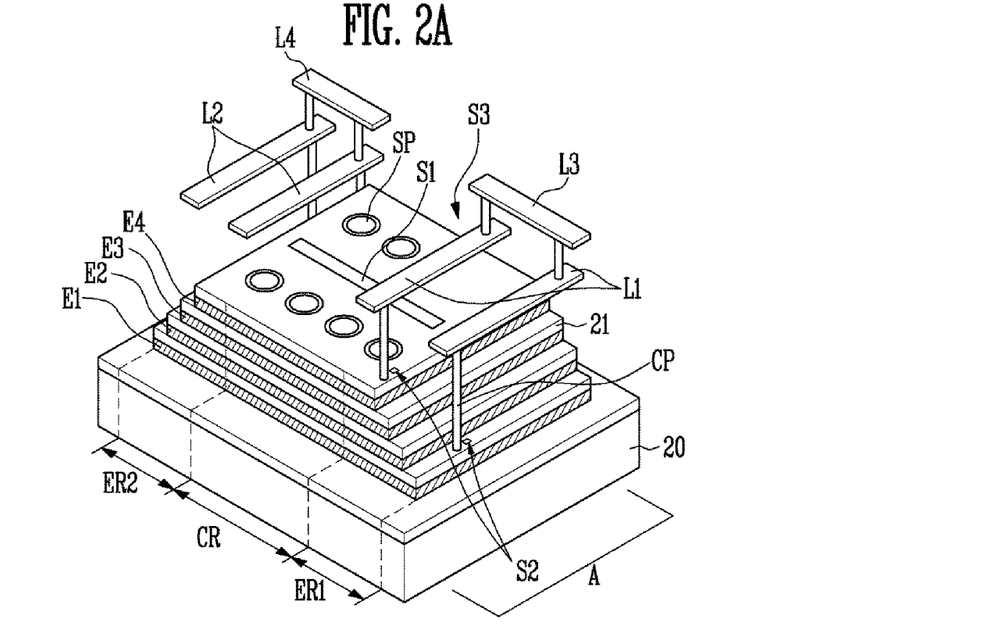
FIGS. 2A and 2B are a perspective view and cross-sectional view showing the capacitor structure of a 3-D nonvolatile memory device according to an embodiment of this disclosure.
Figure 2B:
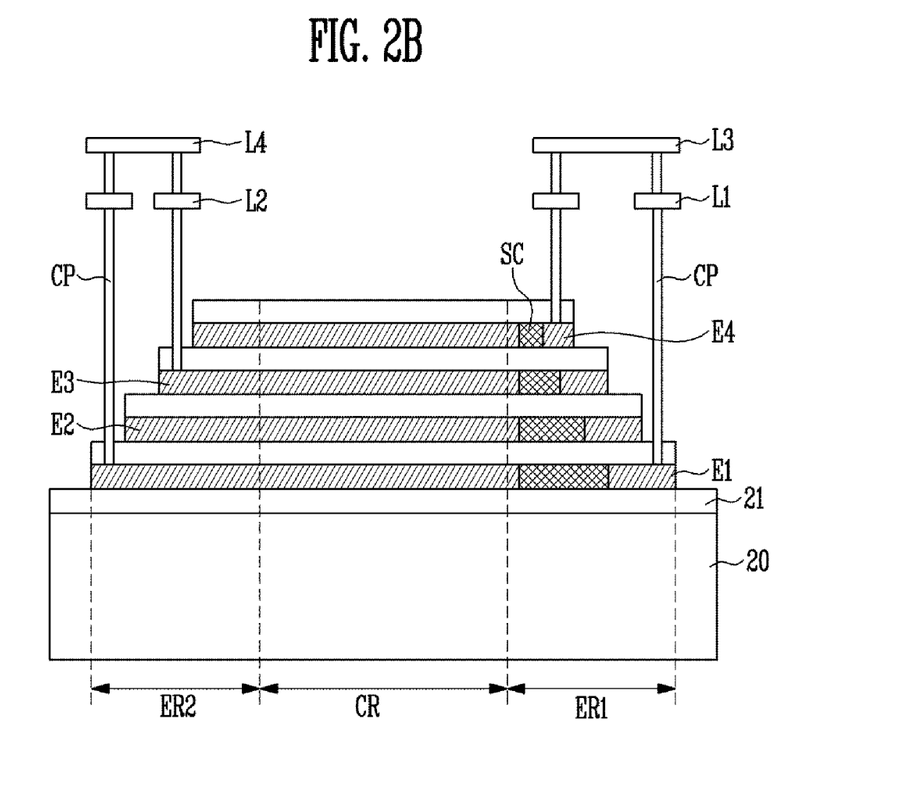

FIGS. 2A and 2B are a perspective view and cross-sectional view showing the capacitor structure of a 3-D nonvolatile memory device according to an embodiment of this disclosure.

As shown in FIGS. 2A and 2B, the 3-D nonvolatile memory device according to an embodiment of this disclosure may include a capacitor structure A. The capacitor structure A may include first to fourth electrode layers E1~E4 and interlayer insulating layers 21 alternately stacked over a substrate 20 in which desired underlying structures may be formed. The underlying structures may include an isolation layer, a transistor, and a pipe gate.

The capacitor structure A may include edge regions ER1 and ER2 and a central region CR disposed between the edge regions ER1 and ER2. The contact pads of the first to fourth electrode layers E1~E4 may be formed in each of the edge regions ER1 and ER2. The interlayer insulating layers 21 on the upper side and the first to fourth electrode layers E1~E4 on the lower side are stepwise patterned in pairs in each of the edge regions ER1 and ER2.

Sacrificial layers SC may be disposed in the first to fourth electrode layers E1~E4, respectively, in part of the edge regions ER1 and ER2 of the capacitor structure A. That is, the capacitor structure A may include the sacrificial layers SC formed in the same layers as the first to fourth electrode layers E1~E4. The sacrificial layers SC may be substantially surrounded by the first to fourth electrode layers E1~E4, respectively. The sacrificial layer SC may be a nitride layer.

Support plugs SP may be disposed in the central region CR of the capacitor structure A and may be formed to penetrate the first to fourth electrode layers E1~E4 and the interlayer insulating layers 21. The support plugs SP may be arranged in a matrix form and formed of semiconductor layers, such as polysilicon layers. Each of the support plugs SP may be substantially surrounded by an insulating layer (not shown). The insulating layer may include a tunnel insulating layer, a charge trap layer, and a charge blocking layer for forming the memory cells of the cell region. Furthermore, although the support plug SP is shown as having a pillar form in which the central part of the support plug SP is fully filled, an insulating layer may be buried in the central part of the support plug SP.

A first slit S1 is disposed between the support plugs SP in the central region CR of the capacitor structure A. One or more second slits S2 may be disposed in the edge regions ER1 and ER2 of the capacitor structure A. Furthermore, a third slit S3 is disposed between the capacitor structures A adjacent to each other.

The first slits S1 and the third slits S3 may be extended in one direction and configured in a line form. The first slits S1 and the third slits S3 may be extended in parallel in the same direction or may be extended to cross each other. Each of the second slits S2 may have a hole form so that the second slits S2 may be formed in the respective layers of the edge regions ER1 and ER2. The second slits S2 may be arranged in zigzags. An insulating layer, such as an oxide layer, is buried in the first to third slits S1~S3.

In the edge regions ER1 and ER2 of the capacitor structure A, at least one contact plug CP is coupled to each of the first to fourth electrode layers E1~E4 disposed in the respective layers. The contact plug CP may be formed of a conductive layer.

The 3-D nonvolatile memory device further may include first and second lines L1~L4 coupled to the respective contact plugs CP. The first and the second lines L1~L4 may be divided into and disposed in the first edge region ER1 and the second edge region ER2. For example, the first lines L1 may be disposed in the first edge region ER1 and coupled to the first electrode layer E1 and the fourth electrode layer E4, respectively. The first lines L2 may be disposed in the second edge region ER2 and coupled to the second electrode layer E2 and the third electrode layer E3, respectively. The 3-D nonvolatile memory device further may include the second line L3 coupling the first lines L1 of the first edge region ER1 and the second line L4 coupling the first lines L2 of the second edge region ER2.

In accordance with an embodiment associated with FIGS. 2A and 2B, the first electrode layer E1, the second electrode layer E2, and the interlayer insulating layer 21 disposed between the first and the second electrode layers E1 and E2 form a first capacitor. The third electrode layer E3, the fourth electrode layer E4, and the dielectric layer 21 disposed between the third and the fourth electrode layer E3 and E4 form a second capacitor. The first and the second capacitors are stacked to form one capacitor structure A. In this structure, the degree of integration of 3-D nonvolatile memory devices can be improved because an area occupied by capacitors in the 3-D nonvolatile memory device is reduced. Furthermore, a desired bias can be supplied to the first to fourth electrode layers E1~E4 of the capacitors through the lines L1~L4.

Additionally, if the capacitor structure according to an embodiment associated with FIGS. 2A and 2B is applied to a 3-D nonvolatile memory device including a plurality of memory cells that are stacked along channels protruded from a substrate, a level difference between a cell region and a peripheral circuit region can be reduced. Furthermore, the cost of production can be reduced because the memory cells disposed in the cell region, together with the capacitors, can be formed.

Figure 3A:
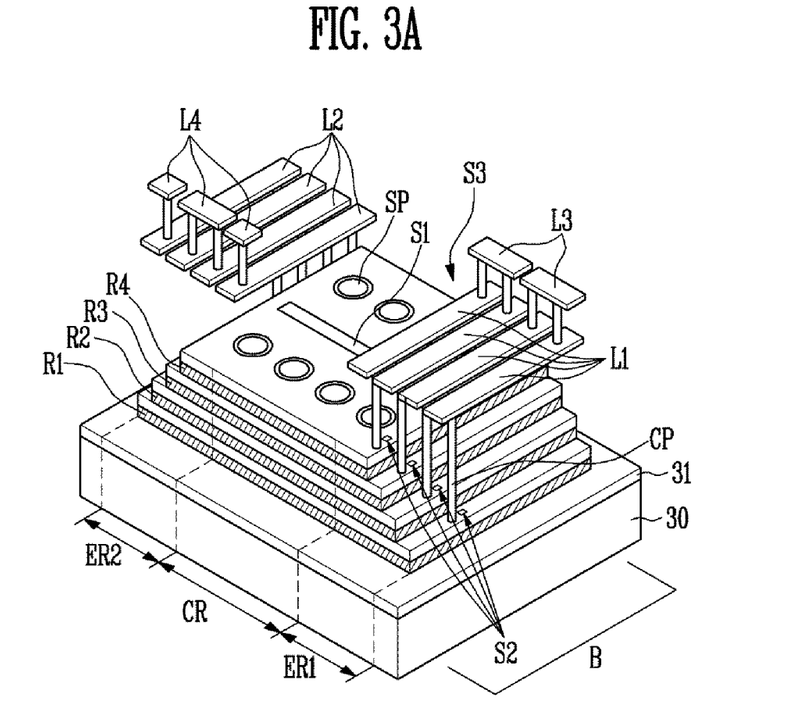
FIGS. 3A and 3B are a perspective view and cross-sectional view showing the register structure of a 3-D nonvolatile memory device according to an embodiment of this disclosure.
Figure 3B:
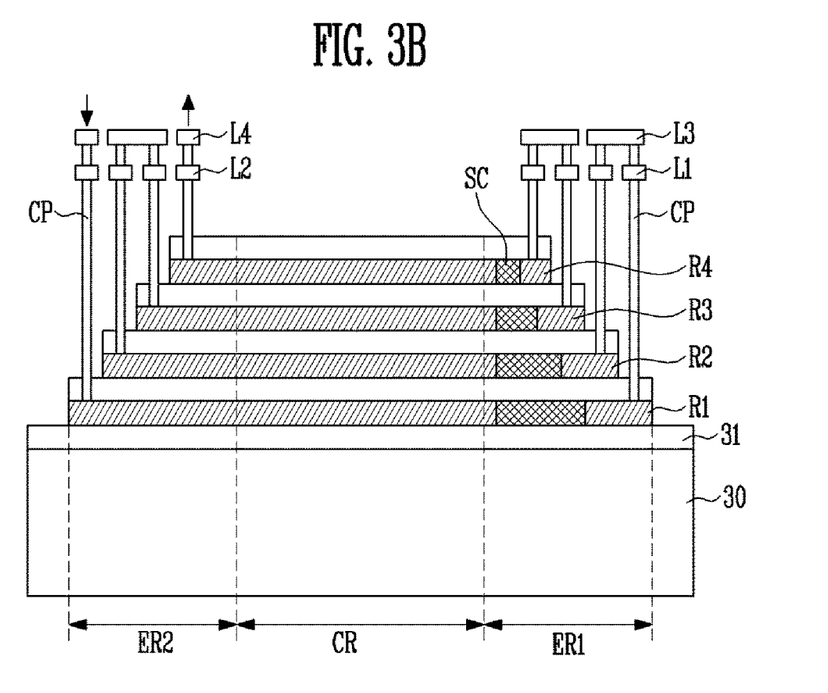

FIGS. 3A and 3B are a perspective view and cross-sectional view showing the register structure of a 3-D nonvolatile memory device according to an embodiment of this disclosure.

As shown in FIGS. 3A and 3B, the 3-D nonvolatile memory device according to an embodiment of this disclosure may include a register structure B. The register structure B may include first to fourth register layers R1~R4 and interlayer insulating layers 31 alternately stacked over a substrate 30 in which desired underlying structures may be formed. The underlying structures may include an isolation layer, a transistor, and a pipe gate.

The register structure B may include edge regions ER1 and ER2 and a central region CR disposed between the edge regions ER1 and ER2. The contact pads of the first to fourth register layers R1~R4 may be formed in each of the edge regions ER1 and ER2. The interlayer insulating layers 31 and the first to fourth register layers R1~R4 of the edge regions ER1 and ER2 are stepwise patterned, and each tiers of the capacitor structure may include one interlayer insulating layer 31 and one register layer R1~R4 formed under the interlayer insulating layer 31.

Sacrificial layers SC may be disposed in the respective register layers R1~R4 in part of the edge regions ER1 and ER2 of the register structure B. That is, the register structure B may include the sacrificial layers SC formed in the same layers as the first to fourth register layers R1~R4. The sacrificial layers SC may be substantially surrounded by the first to fourth register layers R1~R4, respectively. The sacrificial layer SC may be a nitride layer.

Support plugs SP may be disposed in the central region CR of the register structure B and may be formed to penetrate the first to fourth register layers R1~R4 and the interlayer insulating layers 31. The support plugs SP may be arranged in a matrix form and formed of semiconductor layers, such as polysilicon layers. Each of the support plugs SP may be substantially surrounded by an insulating layer (not shown). The insulating layer may include a tunnel insulating layer, a charge trap layer, and a charge blocking layer for forming the memory cells of the cell region. Furthermore, although the support plug SP is shown as having a pillar form in which the central part of the support plug SP is fully filled, an insulating layer may be buried in the central part of the support plug SP.

A first slit S1 is disposed between the support plugs SP in the central region CR of the register structure B. One or more second slits S2 may be disposed in the edge regions ER1 and ER2 of the register structure B. Furthermore, a third slit S3 is disposed between the register structures B adjacent to each other.

The first slits S1 and the third slits S3 may be extended in one direction and configured in a line form. The first slits S1 and the third slits S3 may be extended in parallel in the same direction or may be extended to cross each other. Each of the second slits S2 may have a hole form so that the second slits S2 may be formed in the respective layers of the edge regions ER1 and ER2. The second slits S2 may be arranged in zig-zags. An insulating layer, such as an oxide layer, is buried in the first to third slits S1~S3.

In the edge regions ER1 and ER2 of the register structure B, at least one contact plug CP is coupled to each of the first to fourth register layers R1~R4 disposed in the respective layers. The contact plug CP may be formed of a conductive layer. For example, each of the first to fourth register layers R1~R4 is coupled to two contact plugs CP which are placed in the first edge region ER1 and the second edge region ER2.

The 3-D nonvolatile memory device further may include first to fourth lines L1~L4 coupled the contact plugs CP. The first lines L1 are coupled to the respective contact pads of the first to fourth register layers R1~R4, formed in the first edge region ER1 and the second edge region ER2, through the contact plugs CP. Furthermore, the first lines L1 formed in the first edge region ER1 may be coupled by the third lines L3, and the second lines L2 formed in the second edge region ER2 may be coupled by the fourth lines L4.

In accordance with the an embodiment associated with FIGS. 3A and 3B, the first to fourth register layers R1~R4 are stacked to form one register structure B. Accordingly, the degree of integration of 3-D nonvolatile memory devices can be improved because an area occupied by registers is reduced in the 3-D nonvolatile memory device. Furthermore, a variety of resistance values can be obtained by coupling a desired number of the register layers R1~R4 using the lines L1~L4.

If the register structure according to an embodiment associated with FIGS. 3A and 3B is applied to a 3-D nonvolatile memory device including a plurality of memory cells that are stacked along channels protruded from a substrate, a level difference between a cell region and a peripheral circuit region can be reduced. Furthermore, the cost of production can be reduced because the memory cells of the cell region, together with the capacitors, can be formed.

Figure 4A:
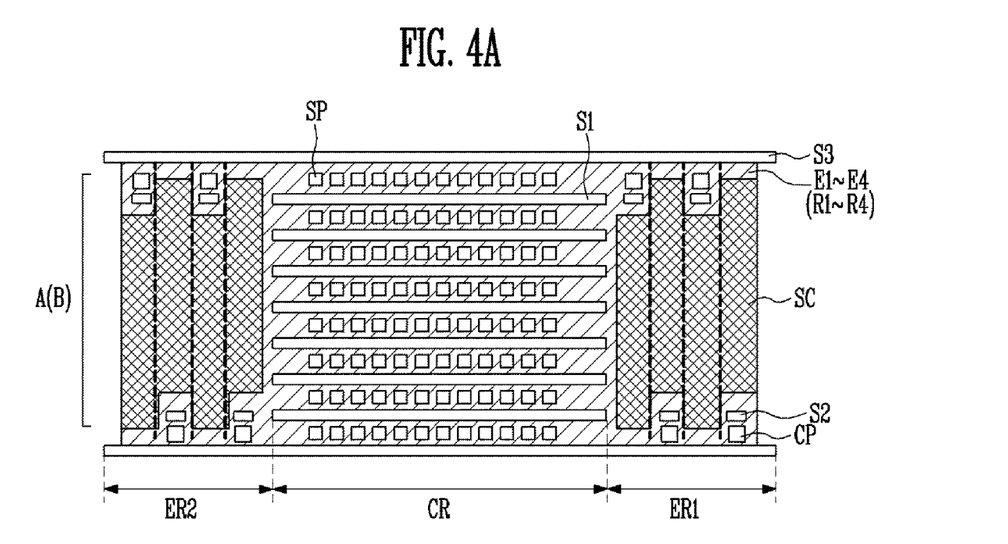
FIGS. 4A to 4C are layout diagrams showing capacitor structures or register structures according to various embodiments of this disclosure.
Figure 4B:
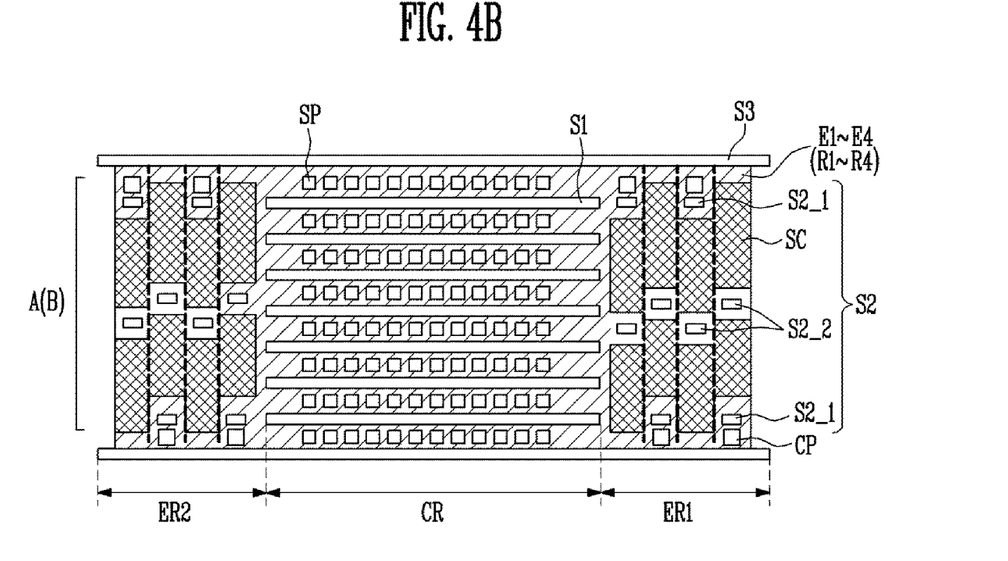
Figure 4C:
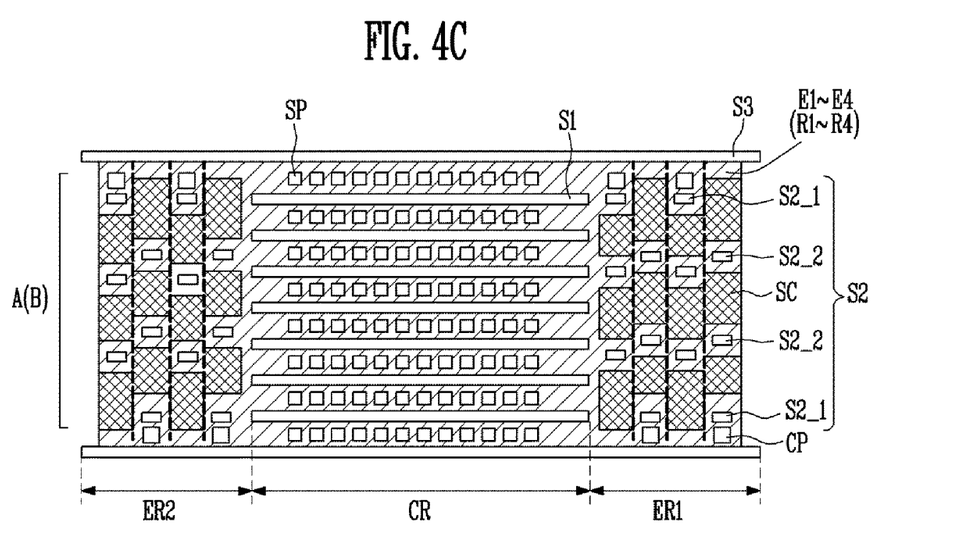

FIGS. 4A to 4C are layout diagrams showing capacitor structures or register structures according to an embodiment of this disclosure.

As shown in FIG. 4A, a capacitor structure A (or a register structure B) according to an embodiment of this disclosure may include electrode layers E1~E4 (or register layers R1~R4) stacked over the substrate 20 or 30 (see FIGS. 2 and 3).

Support plugs SP are arranged in a matrix form in the central region CR of the capacitor structure A (or the register structure B). The support plugs SP may be arranged in the same form as the channels of the memory cells disposed in the cell region.

First slits S1 may be disposed in the central region CR of the capacitor structure A (or the register structure B) and may be formed a line form between the support plugs SP. Furthermore, second slits S2 may be disposed in the edge regions ER1 and ER2 of the capacitor structure A (or the register structure B) and may be formed in a hole form. A third slit S3 is disposed in a line form between the capacitor structures A adjacent to each other (or the register structures B adjacent to each other).

The second slits S2 may be formed in a hole form in the respective tiers of capacitor structure A (see a dotted line in the figures). In various embodiments, the second slits S2 may be formed in a line form. Furthermore, the second slits S2 may be disposed on opposite sides in upper and lower layers. The second slits S2 and the first slits S1 may be arranged on the same line.

The first slit S1 and the third slit S3 are illustrated as being extended in the same direction, but may be extended so that they cross each other.

Additionally, sacrificial layers SC may be disposed in the edge regions ER1 and ER2 of the capacitor structure A (or the register structure B). In accordance with an embodiment of this disclosure, the electrode layers E1~E4 (or the register R1~R4) may be formed by etching the sacrificial layer SC exposed to the inner walls of the first to third slits S1~S3 and filling the etched regions with a conductive layer. Thus, the sacrificial layers SC formed in regions spaced apart from the slits S1~S3 at a specific interval remains intact without being etched. Accordingly, the sacrificial layers SC may be disposed instead of the electrode layers E1~E4 (or the register layers R1~R4) in part of the edge regions ER1 and ER2. The sacrificial layers SC that remain in respective layers may be substantially surrounded by the electrode layers E1~E4 (or the register layers R1~R4), respectively.

Contact plugs CP may be disposed in the edge regions ER1 and ER2 of the capacitor structure A (or the register structure B). The contact plugs CP are coupled to the electrode layers E1~E4 (or the register layers R1~R4), respectively, in each of the edge regions ER1 and ER2. The contact plugs CP may be formed in the edge regions ER1 and ER2 except the regions where the sacrificial layers SC may be formed.

As shown in FIGS. 4B and 4C, a capacitor structure A (or the register structure B) according to an embodiment of this disclosure may include a plurality of second slits S2_1 and S2_2 in the tiers of the capacitor structure A stepwise patterned.

Some of the second slits S2_1 may be formed on opposite sides in upper and lower layers, and the remaining second slits S2_2 may be formed between the second slits S2_1. Furthermore, some of the second slits S2_1 may be arranged on the same line as the first slits S1, and the remaining second slits S2_2 may be arranged to cross the first slit S1. In various embodiments, the second slits S2 may be arranged in various forms in upper and lower layers, such as a zigzag form. Accordingly, an area of the electrode layers E1~E4 or the register layers R1~R4 can be increased by increasing the number of second slits S2.

FIGS. 5A to 9B are cross-sectional views illustrating a method of manufacturing a semiconductor device according to an embodiment of this disclosure. A method of manufacturing a 3-D nonvolatile memory device to which the capacitor and register structures according to the various embodiments associated with FIGS. 2A to 3B of this disclosure are applied is described as an example with reference to FIGS. 5A to 9B. 'A' in each of FIGS. 5A to 9B shows a figure corresponding to a cell region, and 'B' in each of FIGS. 5A to 9B shows a figure corresponding to a peripheral circuit region.

Figure 5A:
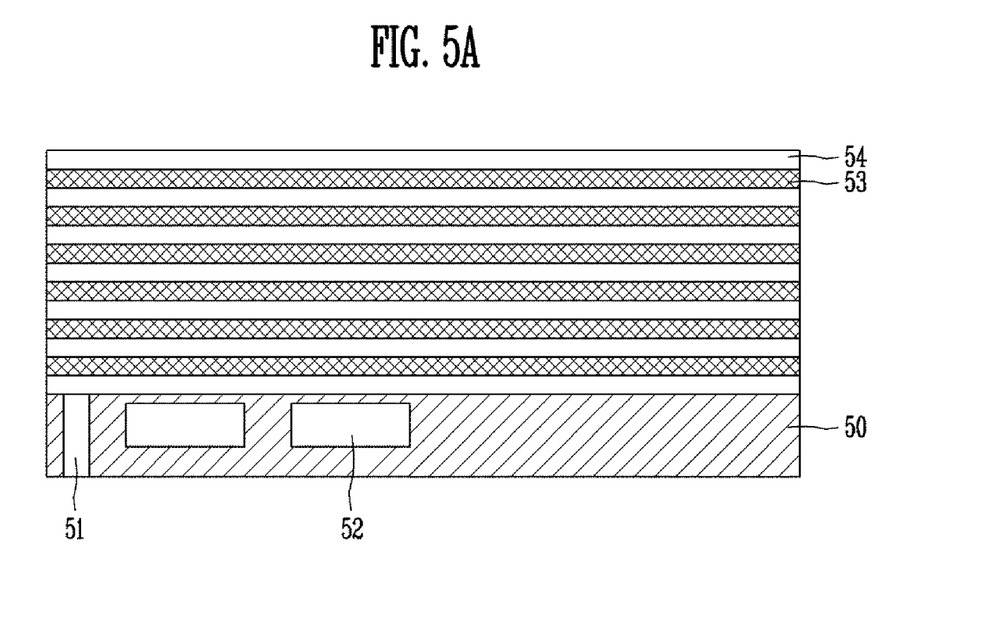
Figure 5B:
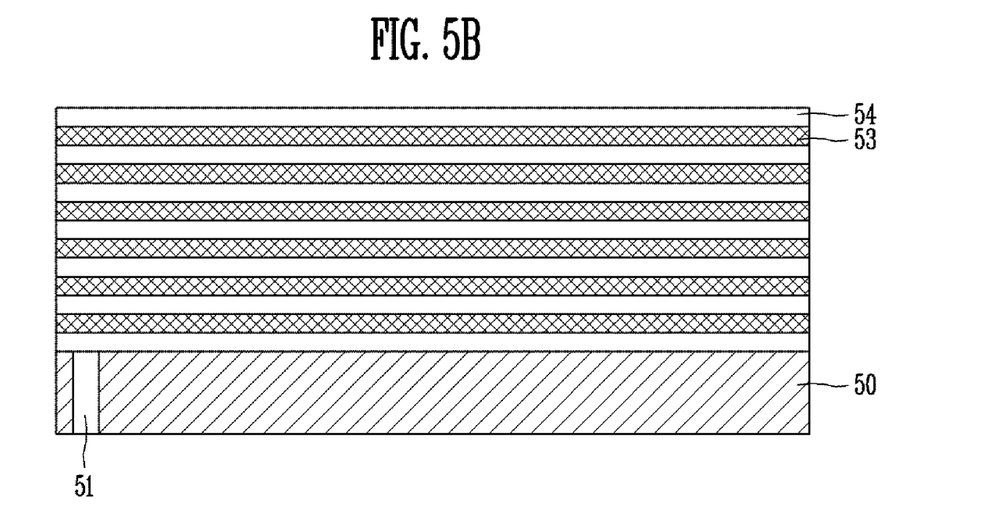

As shown in FIGS. 5A and 5B, a first interlayer insulating layer (not shown) is formed on a substrate (not shown) in which the cell region and the peripheral circuit region are defined. A first conductive layer 50 is formed on the first interlayer insulating layer.

The cell region is a region in which memory cells will be formed, and the peripheral circuit region is a region in which a capacitor, a register, etc. will be formed. Furthermore, the cell region may include a central region in which the memory cells will be formed and edge regions in which the contact pads of word lines will be formed, and the peripheral circuit region may include a central region in which the capacitor, the register, etc. will be formed and edge regions in which the contact pads of electrode layers or register layers will be formed.

The first conductive layer 50 is used to form the pipe gate of the cell region. The first conductive layer 50 formed in the peripheral circuit region may be used as the gate of a transistor.

After patterning the first conductive layer 50, a first insulating layer 51 is formed in the etched region. This process is for forming the pipe gate by separating the first conductive layer 50 of the cell region by the memory block. Here, the first conductive layer 50 of the peripheral circuit region may be patterned according to circumstances.

Next, first trenches may be formed by etching the first conductive layer 50 of the cell region. The first trenches are filled with a first sacrificial layer 52. The first sacrificial layer may be formed of a nitride layer. The first trenches are illustrated as being formed only in the cell region, but the first trenches may be formed in the peripheral circuit region at need.

The first conductive layer 50 may be additionally formed on the first conductive layer 50 in which the first sacrificial layers 52 are filled. In this case, a cell current can be improved because the pipe gate of the cell region surrounds the pipe channel fully.

Second sacrificial layers 53 and second insulating layers 54 are alternately stacked over the first conductive layer 50. The second sacrificial layers 53 formed in the cell region are used to secure regions in which word lines or select lines will be formed in subsequent processes, and the second sacrificial layers 53 formed in the peripheral circuit region are used to secure regions in which the electrode layers of the capacitor or the register layers of the register will be formed. Furthermore, the second insulating layers 54 formed in the cell region are used as interlayer insulating layers for isolating stacked word lines and select lines from one another electrically. The second insulating layers 54 formed in the peripheral circuit region may be used as dielectric layers, each disposed between the stacked electrode layers of the capacitor, or interlayer insulating layers for isolating stacked register layers from one another.

Figure 6A:
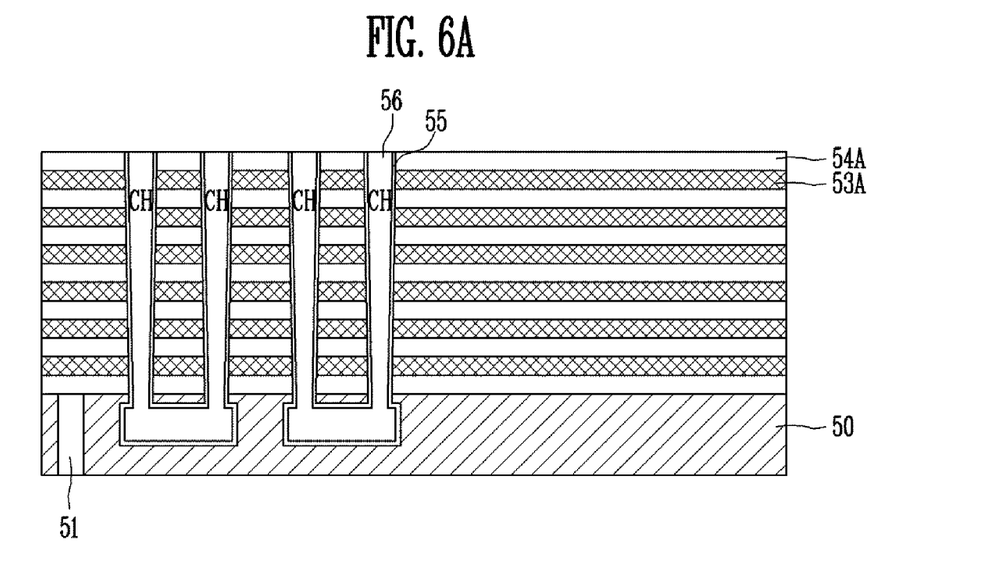
Figure 6B:
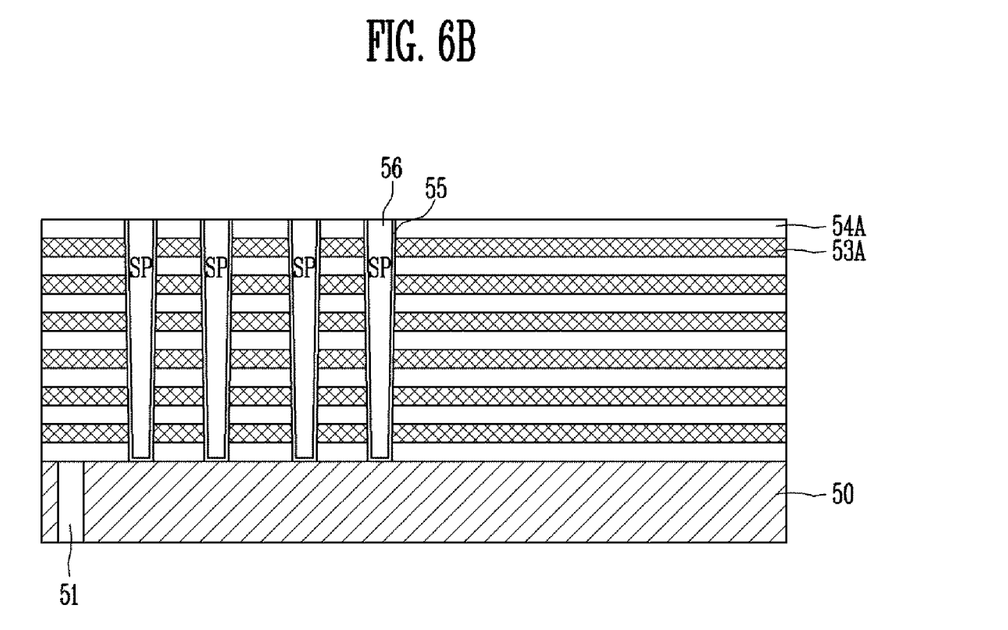

As shown in FIGS. 6A and 6B, second trenches may be formed by etching the second sacrificial layers 53 and the second insulating layers 54. The second trenches may be arranged in a matrix form. Furthermore, in the cell region, each of the first trenches is coupled to a pair of second trenches.

The first sacrificial layers 52 exposed at the bottoms of the second trenches formed in the cell region are removed. As a result, a plurality of substantially U-shaped trenches, each including a pair of the second trenches and the first trench, is formed in the cell region.

An insulating layer 55 is formed on the inner faces of the substantially U-shaped trenches in the cell region and the second trenches in the peripheral circuit region. The insulating layer 55 formed in the cell region is used as the charge blocking layer, the charge trap layer, and the tunnel insulating layer of the memory cells.

A semiconductor layer 56 is formed on the insulating layer 55. The semiconductor layer 56 formed in the cell region is used as the channels CH of the memory cells, and the semiconductor layer 56 formed in the peripheral circuit region is used as support plugs SP. For example, the semiconductor layer 56 may be formed of a polysilicon layer.

The central parts of the substantially U-shaped trenches formed in the cell region and the second trenches formed in the peripheral circuit region are illustrated as being fully filled with the semiconductor layer 56, but the central part of the semiconductor layer 56 may be opened and the opened central part may be filled with an additional insulating layer.

In the figures, the second sacrificial layers and the second insulating layers that are etched in the process of forming the second trenches are denoted by '53A' and '54A', respectively.

Figure 7A:
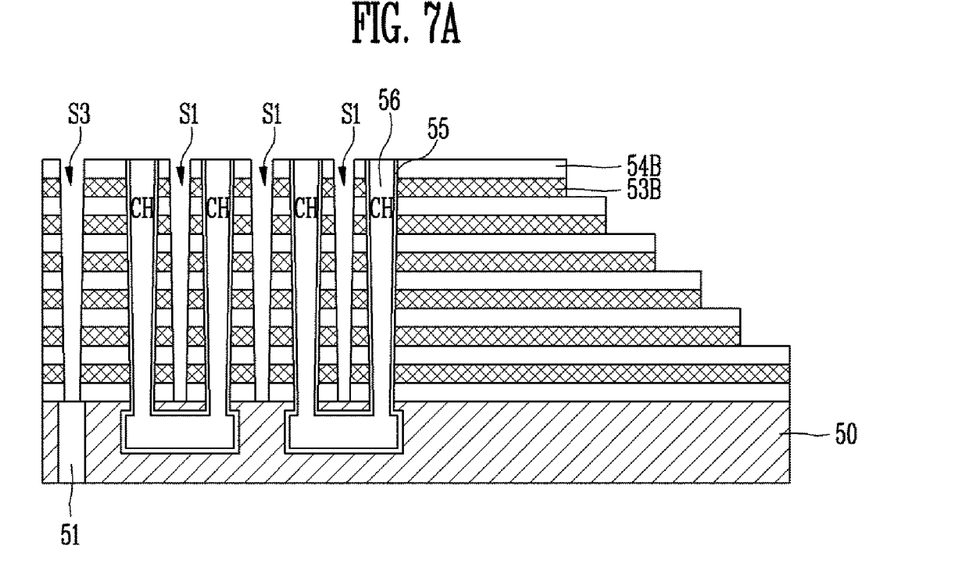
Figure 7B:
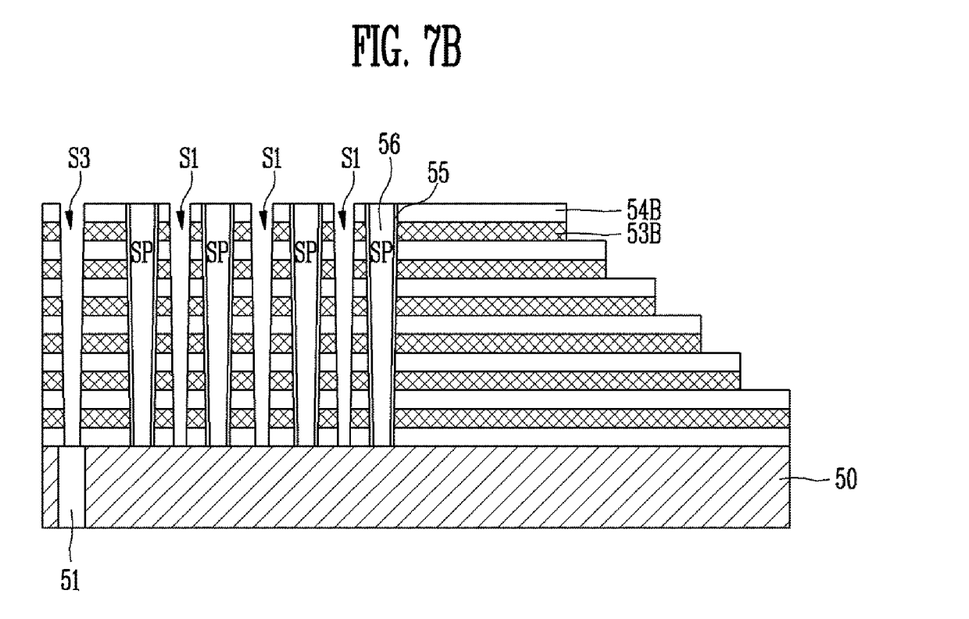

As shown in FIGS. 7A and 7B, edge regions are stepwise patterned by etching the second sacrificial layers 53A and the second insulating layers 54A. This process is for forming the contact pads of word lines stacked in the cell region and the contact pads of electrode layers or register layers stacked in the peripheral circuit region.

Next, first to third slits S1~S3 may be formed by etching by etching the second sacrificial layers 53A and the second insulating layers 54A. Here, the first to third slits S1~S3 may be formed simultaneously or individually.

The third slits S3 may be formed by etching the second sacrificial layers 53A and the second insulating layers 54A formed in the cell region and are configured to separate adjacent memory blocks from each other. Furthermore, the third slits S3 may be formed by etching the second sacrificial layers 53A and the second insulating layers 54A formed in the peripheral circuit region and are configured to separate the capacitor structures A adjacent to each other or the register structures B adjacent to each other.

Each of the first slits S1 formed in the cell region is formed between the channels CH formed in the central region of the memory block. Furthermore, each of the first slits S1 formed in the peripheral circuit region is formed between the support plugs SP disposed in the central region of the capacitor structure A or the register structure B.

Although not shown in the figures, the one or more second slits S2 may be further formed in the peripheral circuit region and disposed in the edge regions ER1 and ER2 of the capacitor structure A or the register structure B. The second slits S2 may be stepwise patterned in a hole form and formed in the respective layers. The one or more second slits S2 may be arranged in staggered form.

In the figures, the etched second sacrificial layers are denoted by '53B', and the etched second insulating layers are denoted by '54B'.

Figure 8A:
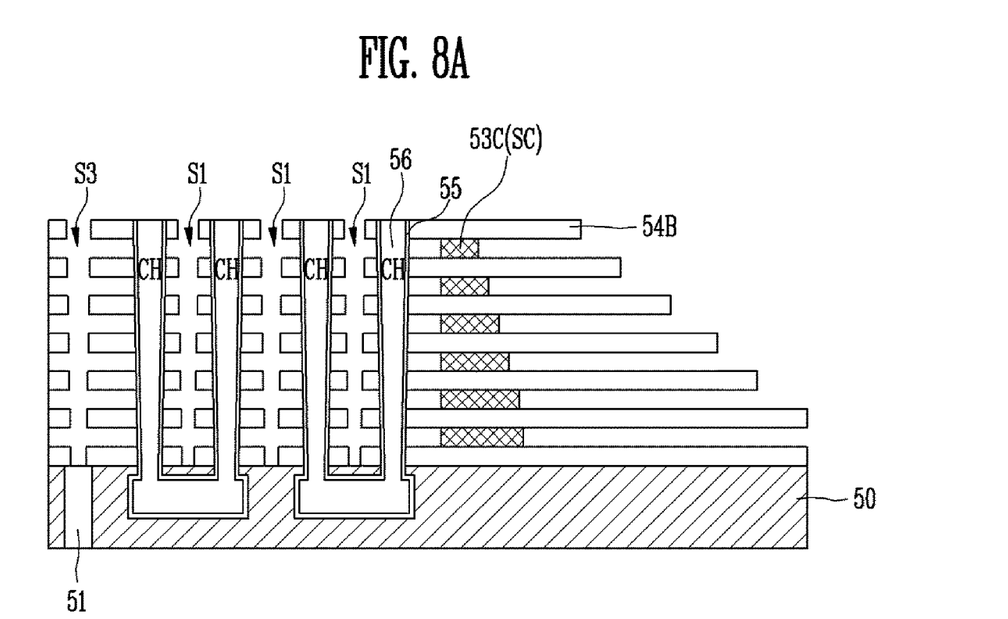
Figure 8B:
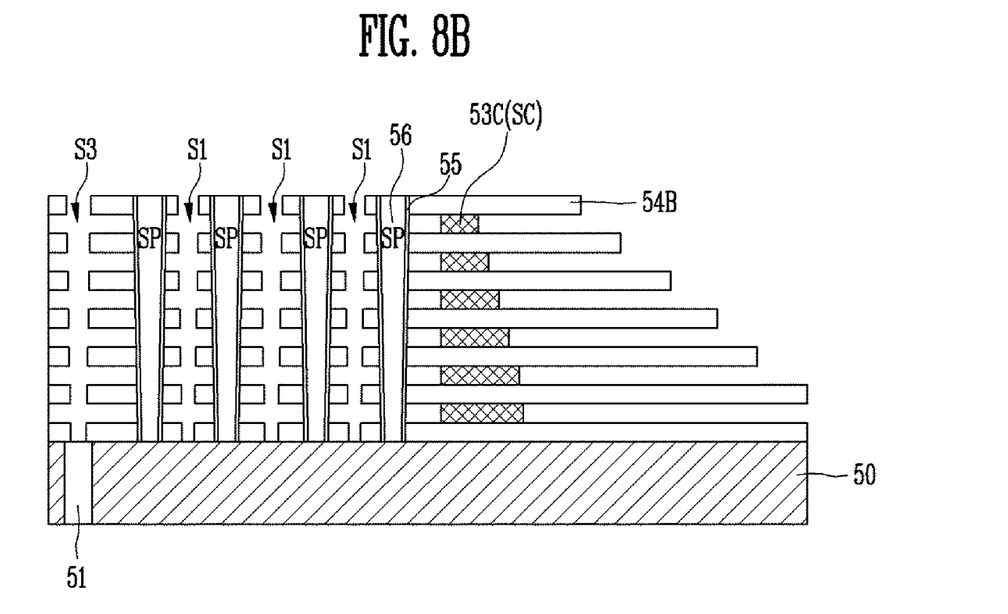

As shown in FIGS. 8A and 8B, the second sacrificial layers 53B exposed to the inner walls of the first to third slits S1~'S3 are etched. Here, the second sacrificial layers 53B are etched so that the second sacrificial layers 53B of the central regions disposed in the cell region and the peripheral circuit region are fully removed, but the second sacrificial layers 53B remain in part of the edge regions disposed in the cell region and the peripheral circuit region, for example, the central parts of the edge regions. Accordingly, the second insulating layers 54B in the edge regions are supported by the remaining second sacrificial layers 53C.

Figure 9A:
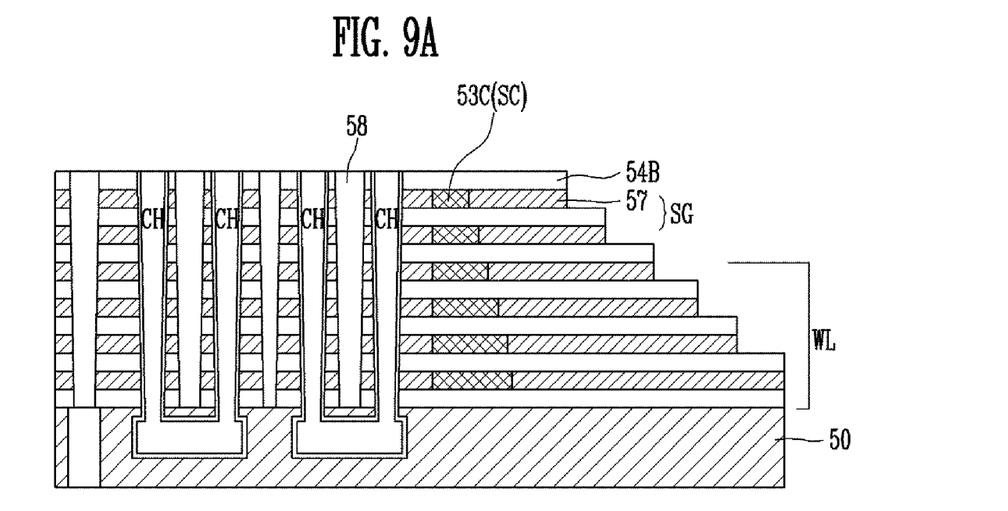
Figure 9B:
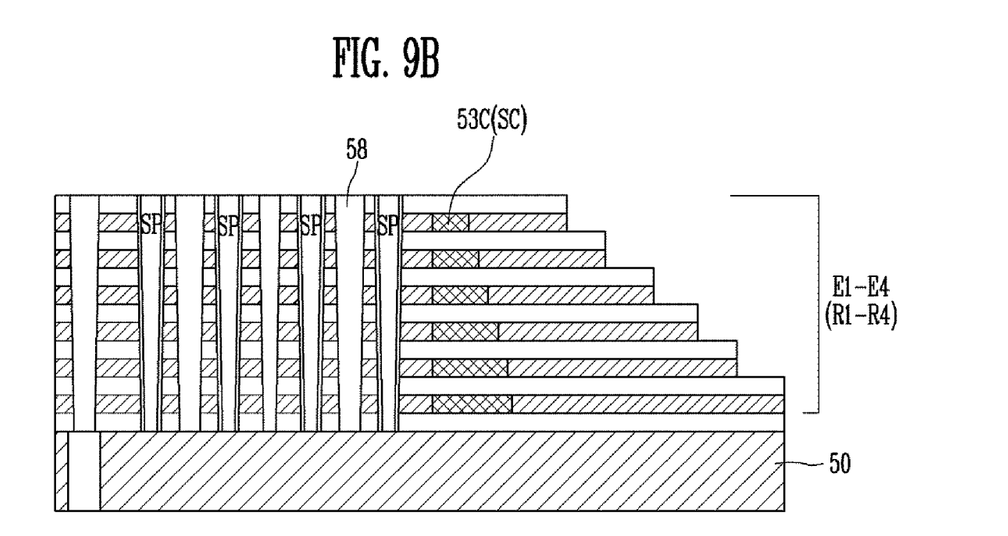

As shown in FIGS. 9A and 9B, the etched regions of the second sacrificial layers 53B are filled with a second conductive layer 57, and the first to third slits S1~S3 are then filled with a third insulating layer 58. Here, the second conductive layer 57 buried in the cell region are used as word lines WL and select lines SL. For example, at least one of the second conductive layers 57, formed at the top, may be used as the select line SL, and the remaining conductive layers 57 may be used as the word lines WL. Furthermore, the second conductive layers 57 buried in the peripheral circuit region may be used as the electrode layers E1~E4 of the capacitor or the register layers R1~R4.

Additionally, the memory block of the cell region and the capacitor structure A and the register structure B of the peripheral circuit region have the same stack structure. Accordingly, only conductive layers corresponding to the word lines included in the memory block may be used as the electrode layers and the register layers, or all the conductive layers corresponding to the word lines and the select lines may be used as the electrode layers and the register layers.

Although not shown in the figures, a second interlayer insulating layer is formed on the entire structure including the results in which the second conductive layers and the third insulating layers 58 may be formed. Contact holes through which surfaces of the word lines, the electrode layers, or the register layers are exposed may be formed by etching the second interlayer insulating layer and the second insulating layers 54B. Contact plugs may be formed in the respective contact holes by filling the contact holes with a conductive layer. The contact plugs formed in the cell region are coupled to the respective contact pads of the word lines WL, and the contact plugs CP formed in the peripheral circuit region are coupled to the respective contact pads of the electrode layers E1~E4 or the register layers R1~R4. Lines may be formed and coupled to the contact plugs formed in the cell region and the peripheral circuit region.

In accordance with an embodiment, the memory cells of the cell region and the capacitors or the register of the peripheral circuit region can be formed at the same time. Accordingly, a level difference between the cell region and the peripheral circuit region can be reduced, and a process of manufacturing a 3-D nonvolatile memory device can be simplified.

Figure 10:
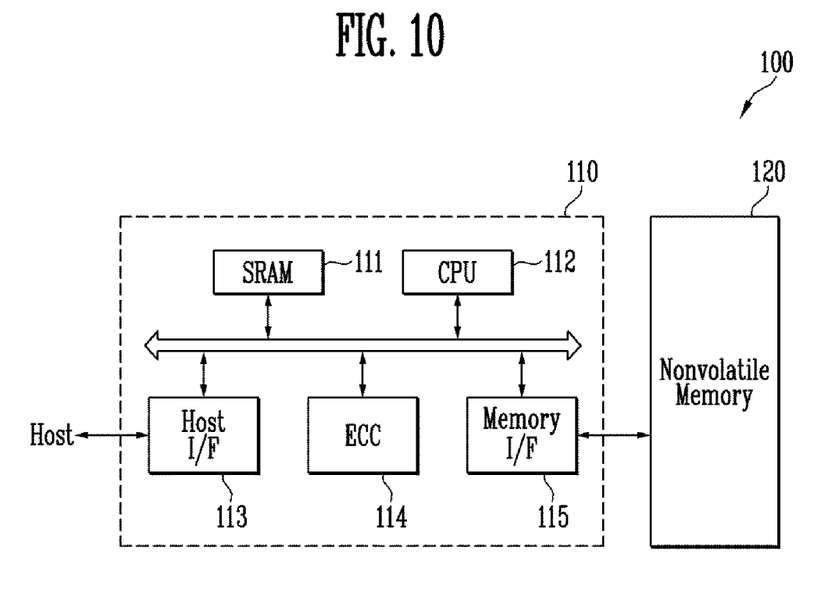
FIG. 10 shows the construction of a memory system according to an embodiment of this disclosure.

FIG. 10 shows the construction of a memory system according to an embodiment of this disclosure.

As shown in FIG. 10, the memory system 100 according to an embodiment of this disclosure may include a nonvolatile memory device 120 and a memory controller 110.

The nonvolatile memory device 120 is configured to include the capacitor structures described with reference to the various embodiments associated with FIGS. 2A, 2B, and 4A to 9B or the register structures described with reference to the various embodiments associated with FIGS. 3A to 9B. In various embodiments, the non-volatile memory device 120 may be a multi-chip package including a plurality of flash memory chips.

The memory controller 110 is configured to control the nonvolatile memory device 120, and it may include SRAM 111, a central processing unit (CPU) 112, a host interface (I/F) 113, an error correction code (ECC) circuit 114, and a memory interface (I/F) 115. The SRAM 111 is used as the operating memory of the CPU 112. The CPU 112 performs an overall control operation for the data exchange of the memory controller 110. The host I/F 113 is equipped with the data exchange protocol of a host that accesses the memory system 100. Furthermore, the ECC circuit 114 circuit detects and corrects errors included in data read from the nonvolatile memory device 120. The memory I/F 115 performs an interface with the nonvolatile memory device 120. The memory controller 110 may further include RCM for storing code data for an interface with the host.

The memory system 100 configured as described above may be a memory card or a solid state disk (SSD) in which the nonvolatile memory device 120 and the controller 110 are combined. For example, if the memory system 100 is an SSD, the memory controller 110 may communicate with the outside (for example, a host) through one of various interface protocols, such as a USB, MMC, PCI-E, SATA, PATA, SCSI, ESDI, and IDE.

Figure 11:
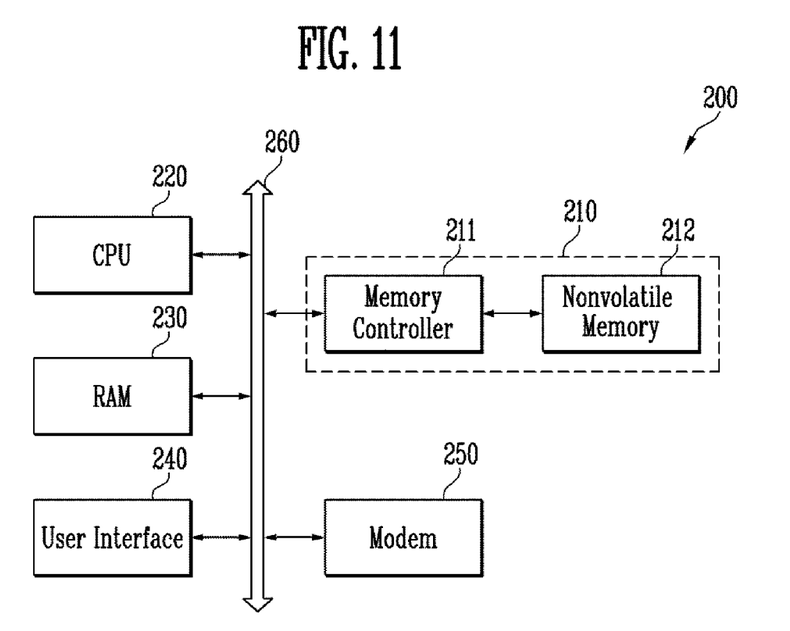
FIG. 11 shows the construction of a computing system according to an embodiment of this disclosure.

FIG. 11 shows the construction of a computing system according to an embodiment of this disclosure.

As shown in FIG. 10, the computing system 200 according to an embodiment of this disclosure may include a CPU 220, RAM 230, a user interface 240, a modem 250, and a memory system 210 all of which are electrically coupled to a system bus 260. If the computing system 200 is a mobile device, the computing system 200 may further include a battery for supplying operating voltages to the computing system 200. The computing system 200 may further include application chipsets, a camera image processor (CIS), mobile DRAM, and so on.

The memory system 210 may include a non-volatile memory device 212 and a memory controller 211, such as those described with reference to FIG. 10.

Additionally, the nonvolatile memory and the memory controller according to an embodiment of this disclosure may be mounted using various forms of packages. For example, the nonvolatile memory and the memory controller may be mounted using a package on package (PoP), ball grid arrays (BGAs), chip scale packages (CSPs), a plastic leaded chip carrier (PLCC), a plastic dual in-Kine package (PDIP), a chip on board (COB), a ceramic dual in-line package (CERDIP), a plastic metric quad flat pack (P-MQFP), thin quad flatpack (TQFP), a small outline package (SOP), a shrink small outline package (SSOP), a thin small outline package (TSOP), a thin quad flatpack (TQFP), a system in package (SIP), a multi-chip package (MCP), a wafer-level fabricated package (WFP), or a wafer-level processed stack package (WSP).

In accordance with this technology, a level difference between the cell region and the peripheral circuit region can be reduced by forming the capacitor of a 3-D nonvolatile memory device including the electrode layers and the dielectric layers which are alternately stacked. Furthermore, a level difference between the cell region and the peripheral circuit region can be reduced by forming the register of a 3-D nonvolatile memory device including the electrode layers and the dielectric layers which are alternately stacked.

What is claimed is:

1. A method of forming a capacitor of a semiconductor device; the method comprising:
    forming a capacitor structure on which edge regions each stepwise patterned and a central region between the edge regions are defined, and configured to comprise sacrificial layers and dielectric layers alternately stacked and support plugs placed in the central region;
    forming first slits, each placed between the support plugs of the central region, and one or more second slits placed in the edge regions by etching the sacrificial layers and the dielectric layers;
    etching the sacrificial layers exposed in the first slits and the second slits so that the sacrificial layers of the central region are fully removed and the sacrificial layers of the edge regions remain partially; and
    forming electrode layers for the capacitor by filling the etched regions of the sacrificial layers with a conductive layer.

2. The method of claim 1, wherein forming the capacitor structure comprises:
    alternately forming the sacrificial layers and the dielectric layers;
    forming the support plugs configured to penetrate the sacrificial layers and the dielectric layers and placed in the central region; and
    patterning the edge regions stepwise by etching the sacrificial layers and the dielectric layers.

3. The method of claim 1, further comprising:
    forming an interlayer insulating layer on results in which the electrode layers for the capacitor are formed;
    forming contact holes through which the electrode layers for the capacitor are exposed, respectively, in the edge regions of the capacitor structure by etching the interlayer insulating layer;
    forming contact plugs in the respective contact holes by filling the contact holes with a conductive layer, wherein the contact plugs coupled to the electrode layers at the edge regions, and at least one of the contact plugs is formed in each of tiers of the capacitor structure; and
    forming lines coupled to the respective contact plugs.

4. The method of claim 1, wherein:
    each of the first slits has a line form, and
    each of the second slits has a hole form.

5. The method of claim 1, wherein the capacitor structure is placed in a peripheral circuit region of a substrate and is formed when forming memory cells placed in a cell region of the substrate.

6. A method of forming a register of a semiconductor device; the method comprising:
    forming a register structure configured to comprise sacrificial layers and interlayer insulating layers alternately stacked, support plugs placed in a central region, and edge regions each stepwise patterned;
    forming first slits, each placed between the support plugs of the central region, and one or more second slits placed in the edge regions by etching the sacrificial layers and the interlayer insulating layers;
    etching the sacrificial layers exposed in the first slits and the second slits so that the sacrificial layers of the central region are fully removed and the sacrificial layers of the edge regions remain partially; and
    forming register layers by filling the etched regions of the sacrificial layers with a conductive layer.

7. The method of claim 6, wherein forming the register structure comprises:
    alternately forming the sacrificial layers and the interlayer insulating layers;
    forming the support plugs configured to penetrate the sacrificial layers and the interlayer insulating layers and placed in the central region; and
    patterning the edge regions stepwise by etching the sacrificial layers and the interlayer insulating layers.

8. The method of claim 6, further comprising:
    forming an interlayer insulating layer on results in which the register layers are formed;
    forming contact holes through which the register layers are exposed, respectively, in the edge regions of the register structure by etching the interlayer insulating layer;
    forming contact plugs in the respective contact holes by filling the contact holes with a conductive layer, wherein the contact plugs coupled to the register layers at the edge regions, and at least one of the contact plugs is formed in each of tiers of the register structure; and
    forming lines each configured to couple two contact plugs formed in different layers of the layers, from among the contact plugs.

9. The method of claim 6, wherein:
    each of the first slits has a line form, and
    each of the second slits has a hole form.

10. The method of claim 6, wherein the register structure is placed in a peripheral circuit region of a substrate and is formed when forming memory cells placed in a cell region of the substrate.

* * * * *